United States Patent
Miyajima et al.

(10) Patent No.: US 7,944,956 B2
(45) Date of Patent: May 17, 2011

(54) HEAT SINK, LASER APPARATUS PROVIDED WITH SUCH HEAT SINK, AND LASER STACK APPARATUS

(75) Inventors: Hirofumi Miyajima, Shizuoka (JP); Hirofumi Kan, Shizuoka (JP); Nobuo Watanabe, Tokyo (JP); Satoru Ooishi, Shizuoka (JP); Nobutaka Suzuki, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 591 days.

(21) Appl. No.: 11/917,971

(22) PCT Filed: Apr. 27, 2006

(86) PCT No.: PCT/JP2006/308848
§ 371 (c)(1),
(2), (4) Date: Dec. 18, 2007

(87) PCT Pub. No.: WO2006/137219
PCT Pub. Date: Dec. 28, 2006

(65) Prior Publication Data
US 2010/0202479 A1   Aug. 12, 2010

(30) Foreign Application Priority Data
Jun. 20, 2005   (JP) .............................. P2005-179459

(51) Int. Cl.
*H01S 3/04*   (2006.01)

(52) U.S. Cl. .......................... 372/35; 372/36; 372/50.12
(58) Field of Classification Search ..................... 372/35
See application file for complete search history.

(56) References Cited

U.S. PATENT DOCUMENTS

| 6,097,744 A * | 8/2000 | Takigawa et al. ............... 372/34 |
| 6,917,638 B2 * | 7/2005 | Suzuki et al. .................. 372/36 |
| 2005/0141575 A1 * | 6/2005 | Lorenzen ........................ 372/34 |

FOREIGN PATENT DOCUMENTS

| JP | 2003-273441 | 9/2003 |
| JP | 2004-186527 | 7/2004 |
| JP | 2004-207609 | 7/2004 |
| JP | 2004-207619 | 7/2004 |

* cited by examiner

*Primary Examiner* — Minsun Harvey
*Assistant Examiner* — Xnning Niu
(74) *Attorney, Agent, or Firm* — Drinker Biddle & Reath LLP

(57) ABSTRACT

A heat sink has a first flat plate, a partition plate, and a second flat plate. The first flat plate has an upper surface in which a first recess is formed. The second flat plate has a lower surface in which a second recess is formed, and an upper surface on which a semiconductor laser element is mounted. These recesses form a part of a refrigerant channel. The partition plate has a lower surface covering the first recess, an upper surface covering the second recess, and at least one through hole having the first recess communicated with the second recess. The first flat plate and the second flat plate both have a first coefficient of thermal expansion. The partition plate has a second coefficient of thermal expansion lower than the first coefficient of thermal expansion.

1 Claim, 7 Drawing Sheets

Fig.2
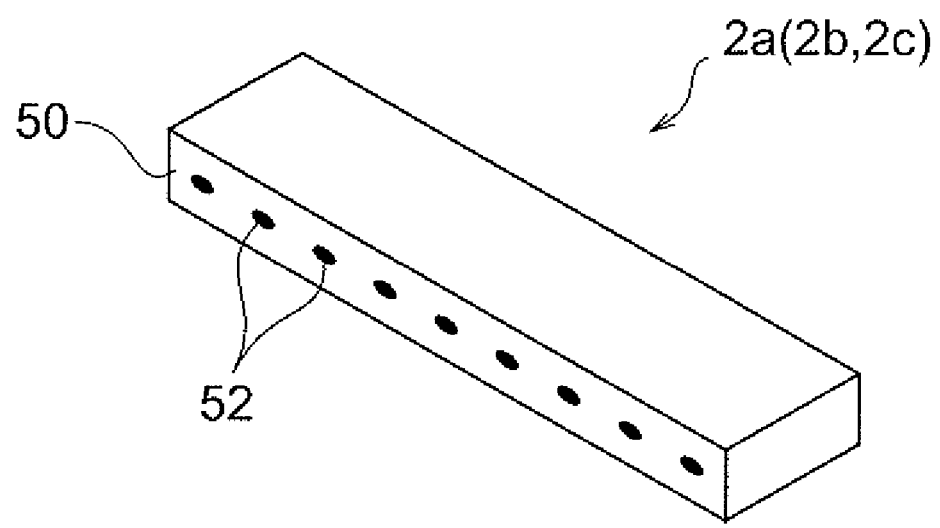
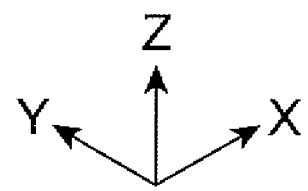

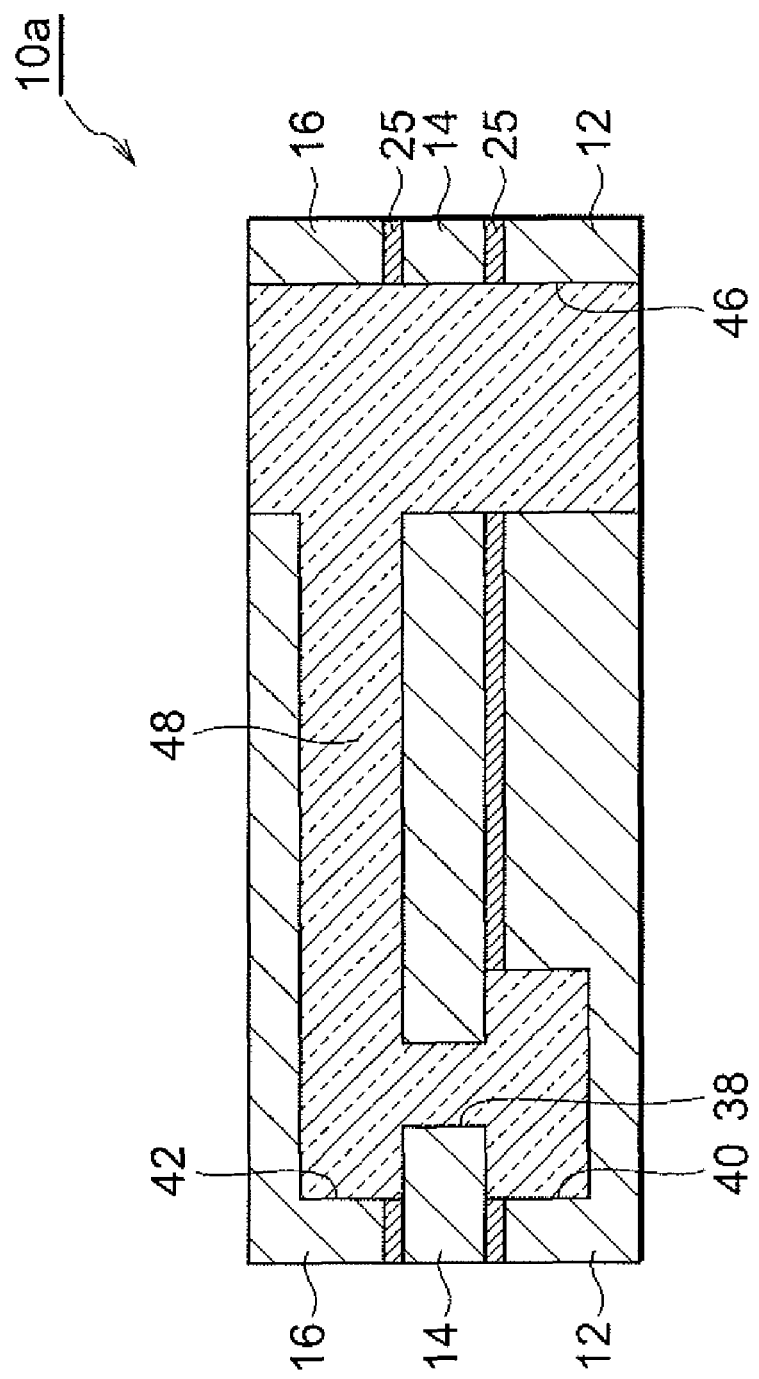

HEAT SINK, LASER APPARATUS PROVIDED WITH SUCH HEAT SINK, AND LASER STACK APPARATUS

TECHNICAL FIELD

The present invention relates to a heat sink used for cooling a heat generating body such as a semiconductor device, and to semiconductor laser apparatus and semiconductor laser stack apparatus using it.

BACKGROUND ART

In recent years, a water-cooling type heat sink is often used for effectively cooling a high-power laser diode. In order to increase the cooling efficiency, it is desirable to make the heat sink of a material with a high thermal conductivity. Furthermore, the material of the heat sink is preferably one having a coefficient of thermal expansion close to that of the laser diode. The reason for it is that if the laser diode and the heat sink thermally expand and contract with temperature change caused by heat generation during driving of the laser diode or by repetitive activation and deactivation of the laser diode, the difference between the coefficients of thermal expansion of the two materials will give rise to stress strain in the laser diode and result in degradation of characteristics of the laser diode. However, materials having a high thermal conductivity and a coefficient of thermal expansion nearly equal to that of the laser diode are expensive, and production cost will be very high if the whole heat sink is made of such a material.

Japanese Patent Application Laid-Open No. 2004-186527 discloses the heat sink that can effectively cool the laser diode and that can prevent the degradation of the laser diode characteristics due to the difference between the coefficients of thermal expansion. This heat sink has the structure in which three plates (upper plate, partition plate, and lower plate) are stacked. The upper plate is provided with a submount portion on which the laser diode is mounted, and only this submount portion is made of a material having the coefficient of thermal expansion nearly equal to that of the laser diode. In order to keep the production cost low, the portion (base portion) other than the submount portion in the upper plate, the partition plate, and the lower plate are made of a material consisting primarily of copper, which has the coefficient of thermal expansion higher than that of the laser diode.

DISCLOSURE OF THE INVENTION

Problem to be Solved by the Invention

However, since the coefficient of thermal expansion of the submount portion is far different from that of the other portions, large stress is applied to the submount portion according to temperature change of the laser diode and it can cause stress strain on the laser diode on the submount portion. In addition, it will cause joint fatigue at the interface between the submount portion and the other portions and can also result in detachment of the submount portion.

The present invention has been accomplished in view of the above-described circumstances, and an object of the invention is to provide a heat sink capable of reducing the stress strain on a heat generating body, and a laser apparatus and laser stack apparatus therewith.

Means for Solving the Problem

In one aspect, the present invention relates to a heat sink for cooling a heat generating body. This heat sink comprises an electrically conductive first flat plate having an upper surface in which a first recess is formed; an electrically conductive second flat plate having a lower surface in which a second recess is formed, and an upper surface on which the heat generating body is to be mounted; an electrically conductive partition plate having a lower surface covering the first recess, an upper surface covering the second recess, and at least one through hole having the first recess communicated with the second recess; a refrigerant inlet extending from one of the first recess and the second recess and adapted for inflow of a refrigerant into the heat sink; and a refrigerant outlet extending from the other of the first recess and the second recess and adapted for outflow of the refrigerant from the heat sink. The first flat plate and the second flat plate both have a first coefficient of thermal expansion. The partition plate has a second coefficient of thermal expansion lower than the first coefficient of thermal expansion.

The first flat plate may have a thermal conductivity higher than the partition plate.

The first flat plate and the second flat plate may be comprised of Cu.

The partition plate may be comprised of Ni, Au, W, Pt, Ti or stainless steel.

In another aspect, the present invention relates to a laser apparatus comprising the heat sink having the above-described configuration; and a semiconductor laser element mounted on the upper surface of the second flat plate of the heat sink. This semiconductor laser element has a coefficient of thermal expansion lower than that of the first flat plate and the second flat plate.

In still another aspect, the present invention relates to a laser stack apparatus comprising a first heat sink, a second heat sink, a first semiconductor laser element, and a second semiconductor laser element. Each of the first heat sink and the second heat sink is the heat sink having the above-described configuration. The first semiconductor laser element is located between the upper surface of the second flat plate of the first heat sink and a lower surface of the first flat plate of the second heat sink and has a coefficient of thermal expansion lower than that of the first flat plate and the second flat plate. The second semiconductor laser element is mounted on the upper surface of the second flat plate of the second heat sink and has a coefficient of thermal expansion lower than that of the first flat plate and the second flat plate.

The present invention can be better understood with reference to the detailed description and accompanying drawings below. It is noted that the accompanying drawings are presented by way of illustration only and are by no means intended to limit the scope of the present invention.

BRIEF DESCRIPTION OF THE DRAWINGS

FIG. 2 is a perspective view showing a laser array.

FIG. 7 is a sectional view of the heat sink along line VII-VII in FIG. 3.

DESCRIPTION OF REFERENCE SYMBOLS

1 laser stack apparatus; 2a, 2b, 2c laser arrays; 3a, 3b copper plates; 4a, 4b lead plates; 5 supply tube; 6 discharge tube; 7a, 7b, 7c, 7d insulating members; 10a, 10b, 10c heat sinks; 12 lower plate; 14 partition plate; 16 upper plate; 18, 20 apertures; 22 first recess; 26, 28 apertures; 30 second recess; 34, 36 apertures; 38 water-conducting holes; 40 inflow channel; 42 outflow channel; 44 inlet; 46 outlet; 48 cooling water; R2a laser mount region

BEST MODE FOR CARRYING OUT THE INVENTION

An embodiment of the present invention will be described below in detail with reference to the accompanying drawings. The same elements will be denoted by the same reference symbols in the description of the drawings, without redundant description.

Figure 1:
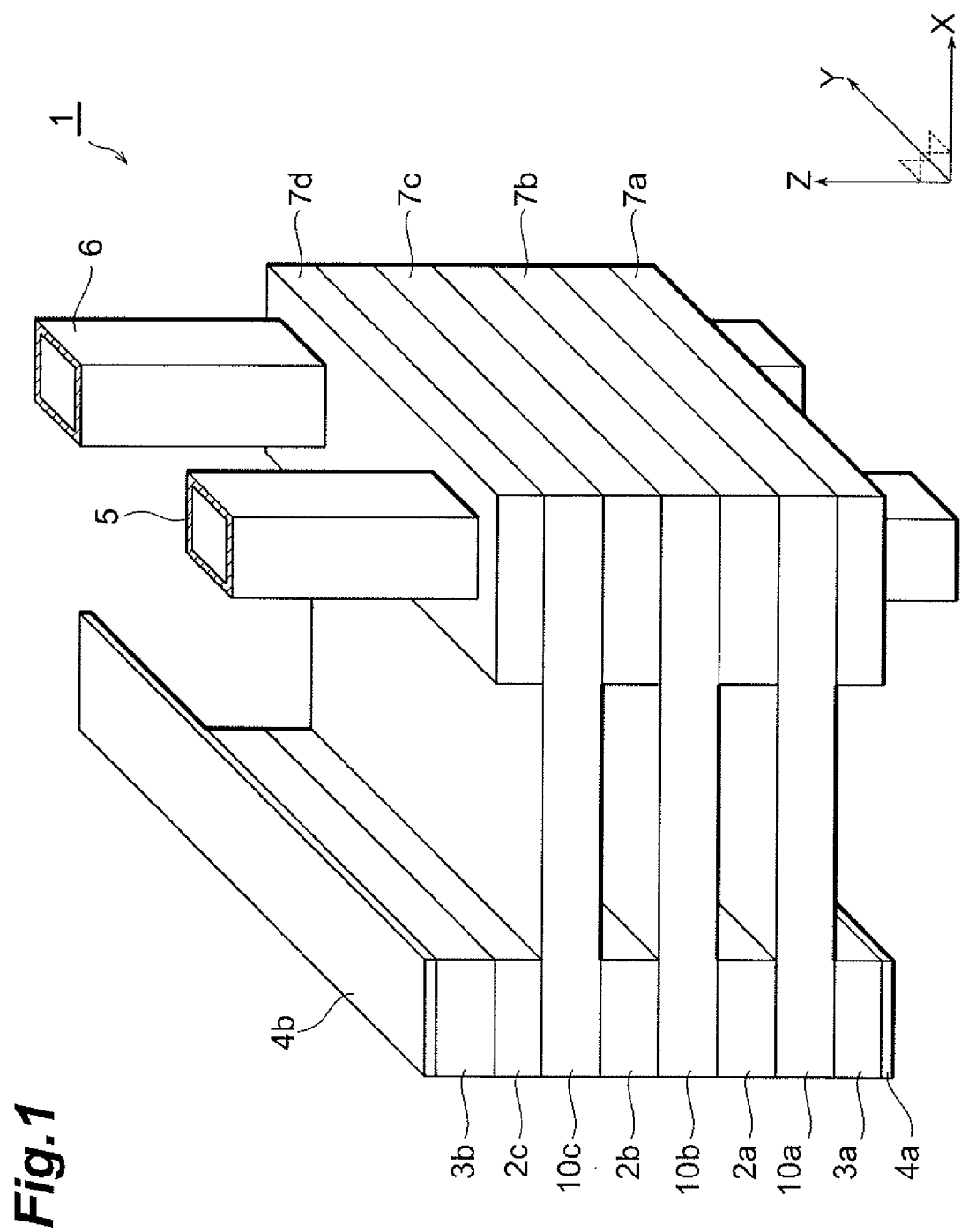
FIG. 1 is a perspective view showing a configuration of an embodiment of the laser stack apparatus according to the present invention.

FIG. 1 is a perspective view showing a configuration of an embodiment of the laser stack apparatus according to the present invention. This laser stack apparatus 1 has three laser arrays 2a-2c, two copper plates 3a and 3b, two lead plates 4a and 4b, a supply tube 5, a discharge tube 6, four insulating members 7a-7d, and three heat sinks 10a-10c.

Each of the components will be described below. For convenience' sake of description, the positive direction of the Z-axis is taken up and the negative direction of the Z-axis is taken down in FIG. 1.

FIG. 2 is a perspective view showing a laser array 2a. The laser arrays 2b and 2c have the same structure as the laser array 2a. Each laser array is a semiconductor laser element having a light emitting surface 50. A plurality of light emitting portions 52 are arranged on a line and at fixed intervals along the Y-axis direction in the light emitting surface 50. For this reason, the laser arrays 2a-2c are also called laser diode bars. During driving of the laser arrays, each light emitting portion 52 emits laser light along the axial direction of the laser array (cavity direction). In the present embodiment the axial direction is parallel to the X-axis.

As shown in FIG. 1, the laser array 2a is located between an upper surface of the heat sink 10a and a lower surface of the heat sink 10b; the laser array 2b is located between an upper surface of the heat sink 10b and a lower surface of the heat sink 10c; the laser array 2c is located on an upper surface of the heat sink 10c.

The laser arrays 2a-2c are electrically connected to each other through the heat sinks 10b and 10c. A lower surface of the laser array 2a is electrically connected through the heat sink 10a and copper plate 3a to the lead plate 4a, and an upper surface of the semiconductor laser array 2c is electrically connected through the copper plate 3b to the lead plate 4b. For this reason, when a voltage is applied between the lead plate 4a and the lead plate 4b, the laser arrays 2a-2c are driven so that the laser arrays 2a-2c can emit laser light.

Each of the supply tube 5 and the discharge tube 6 is arranged to penetrate the heat sinks 10a-10c. The supply tube 5 is connected to an inlet 44 (described below) which penetrates the heat sinks 10a-10c and the discharge tube 6 is connected to an outlet 46 (described below) which penetrates the heat sinks 10a-10c. Therefore, a refrigerant is allowed to flow through the supply tube 5 to the heat sinks 10a-10c and to flow through the discharge tube 6 out of the heat sinks 10a-10c. In the present embodiment the refrigerant used is water.

The insulating members 7a, 7b, 7c, 7d of rubber are provided so as to surround the supply tube 5 and the discharge tube 6, on the lower surface of the heat sink 10a, in the space between the upper surface of the heat sink 10a and the lower surface of the heat sink 10b, in the space between the upper surface of the heat sink 10b and the lower surface of the heat sink 10c, and on the upper surface of the heat sink 10c, respectively. The insulating members 7a-7d ensure insulation between the heat sinks and prevent leakage of the refrigerant.

Figure 3:
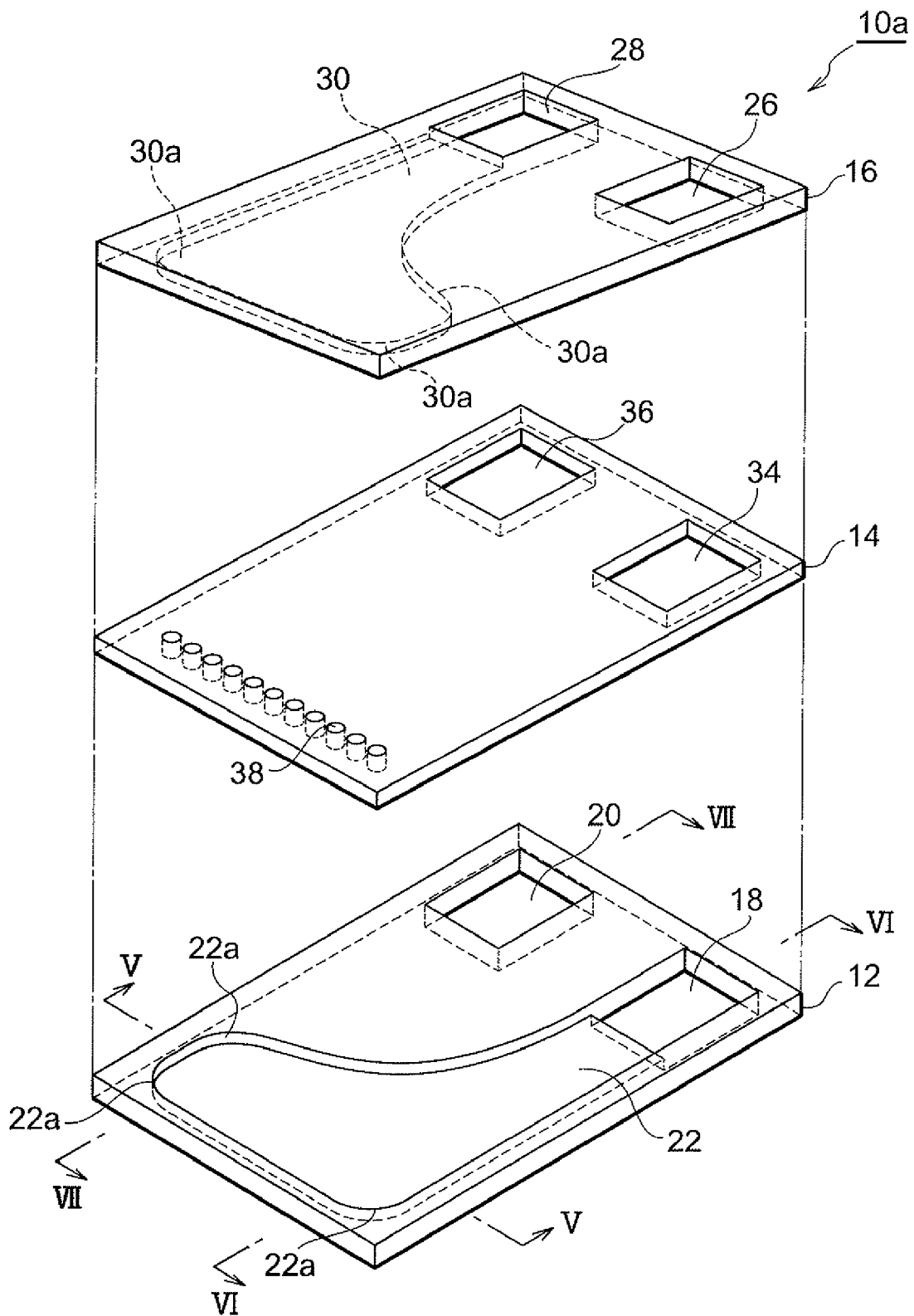
FIG. 3 is an exploded perspective view showing a structure of a heat sink.
Figure 4:
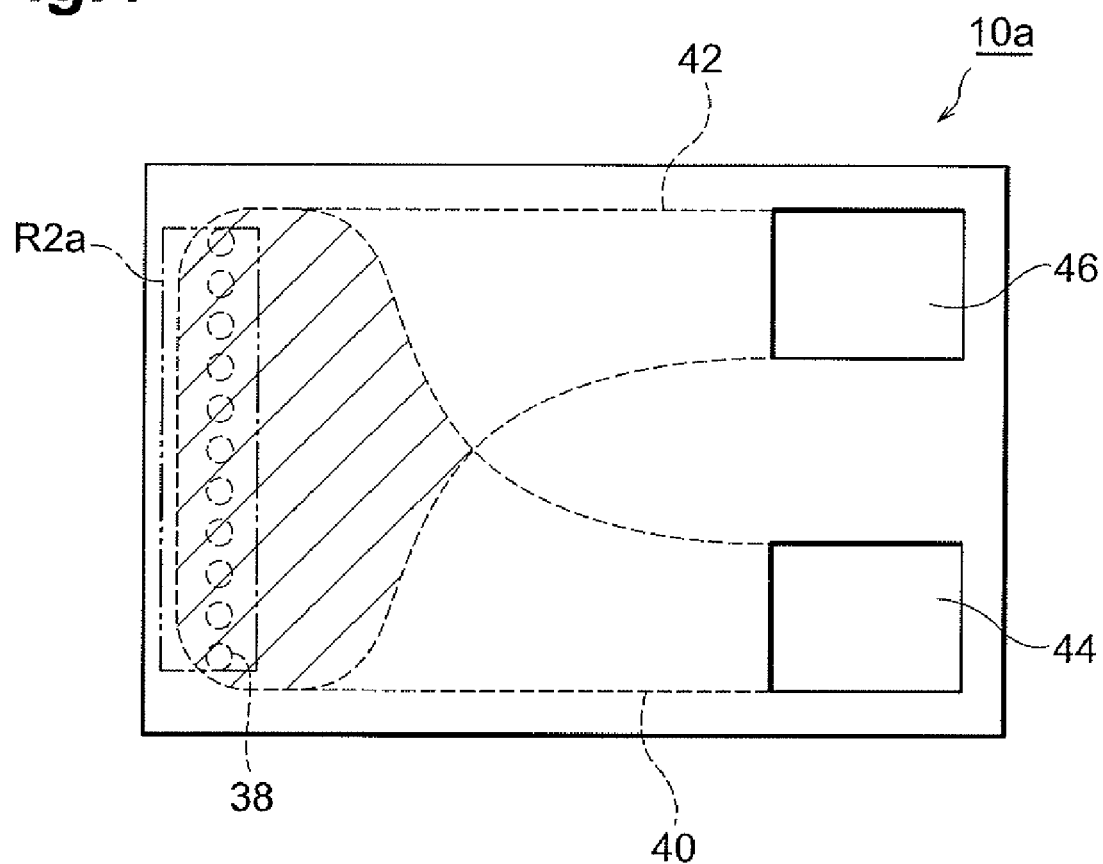
FIG. 4 is a plan view of the heat sink.
Figure 5:
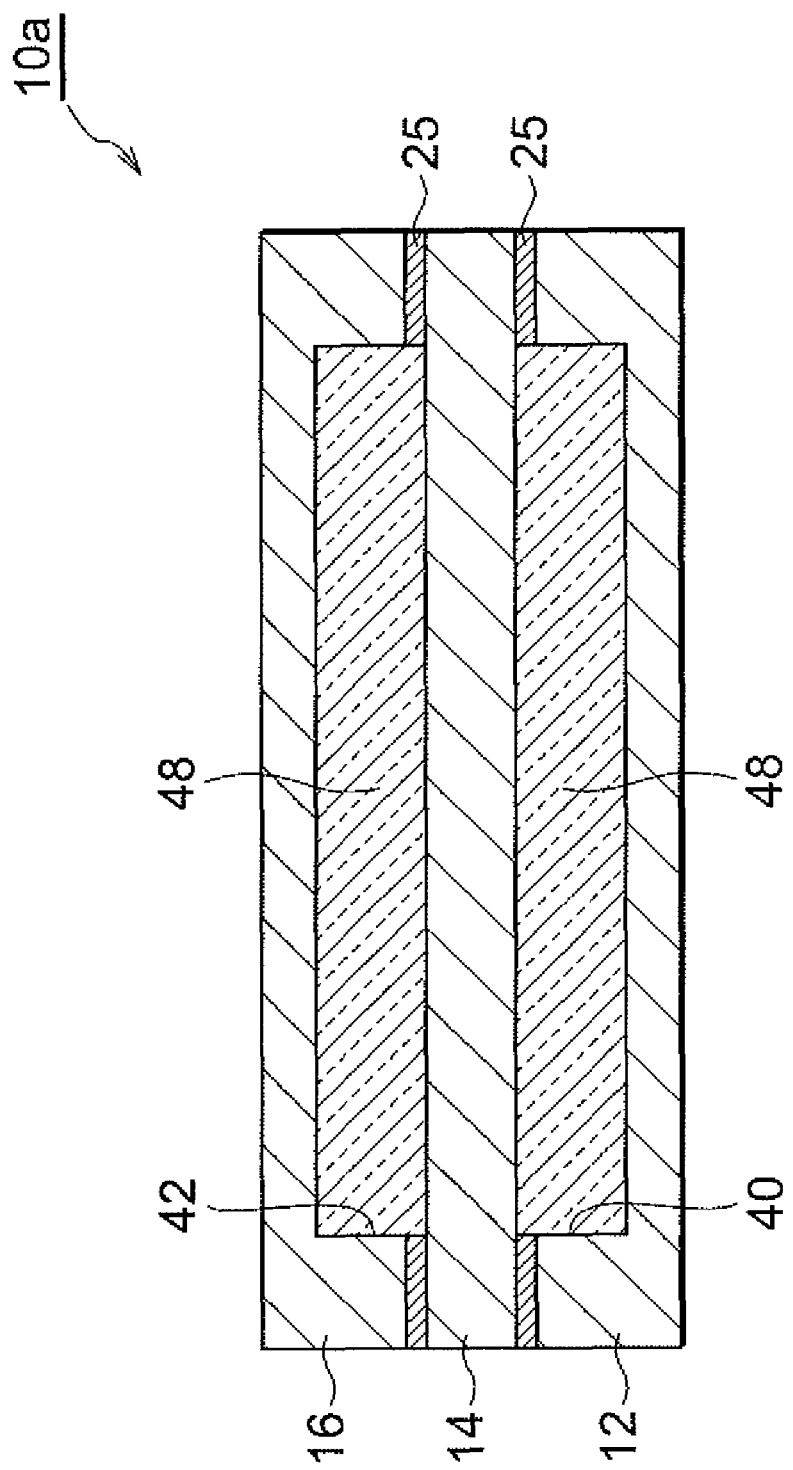
FIG. 5 is a sectional view of the heat sink along line V-V in FIG. 3.
Figure 6:
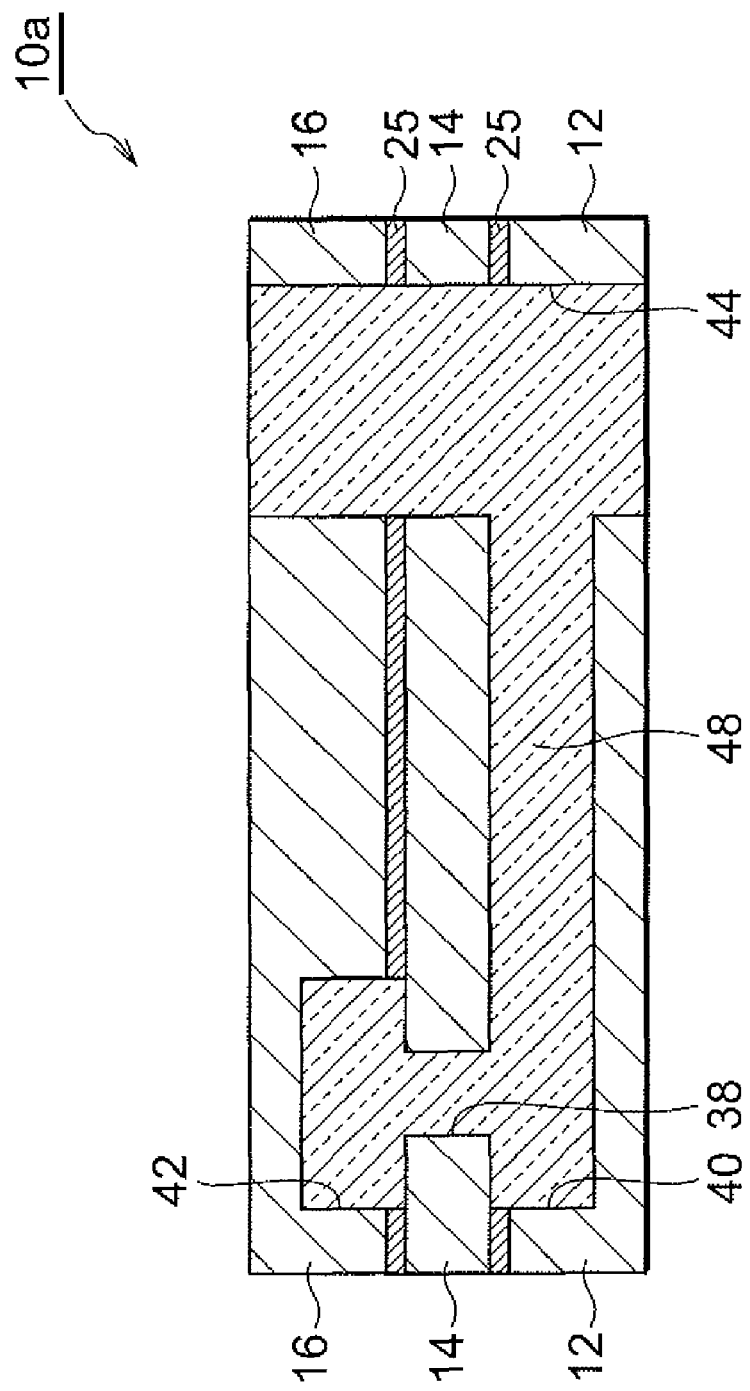
FIG. 6 is a sectional view of the heat sink along line VI-VI in FIG. 3.

The structure of heat sink 10a will be described below with reference to FIGS. 3 to 7. FIG. 3 is an exploded perspective view showing the structure of heat sink 10a, and FIG. 4 a plan view of the heat sink 10a from above (in the Z-axis direction in FIG. 1). FIGS. 5, 6, and 7 are sectional views of the heat sink 10a along line V-V, along line VI-VI, and along line VII-VII, respectively, in FIG. 3. The heat sinks 10b and 10c have the same structure as the heat sink 10a.

As shown in FIG. 3, the heat sink 10 has the structure in which a lower plate 12, a partition plate 14, and an upper plate 16 are stacked in order. These plates are bonded to each other with an electrically conductive adhesive 25. The adhesive 25 to be used is preferably Ag, AuSn, or the like with a high thermal conductivity.

The lower plate 12 is a flat plate of copper having a thickness of about 400 μm and has two apertures 18, 20 which penetrate the lower plate 12. A recess 22 having a depth of about 200 μm is formed in the upper surface of the lower plate 12 (which is a surface in contact with the partition plate 14). The recess 22 forms a part of a refrigerant channel in the heat sink 10a. One end of the recess 22 is in communication with the aperture 18 and the other end is expanded in the width direction of the lower plate 12 (the Y-axis direction in FIG. 1). The aperture 18 extends from the recess 22 to the lower surface of the lower plate 12. Corners 22a of the recess 22 are made in a curved shape, in order to reduce the flow resistance of the cooling water flowing in the heat sink 10a, so as to reduce stagnation. This recess 22 can be formed, for example, by etching of the upper surface of the lower plate 12.

The upper plate 16 is a flat plate of copper having a thickness of about 400 μm and has two apertures 26, 28 penetrating the upper plate 16, at positions corresponding to the respective apertures 18, 20 of the lower plate 12. A recess 30 having a depth of about 200 μm is formed in the lower surface of the upper plate 16. The recess 30 also forms a part of the refrigerant channel as the recess 22 does. One end of the recess 30 is in communication with the aperture 28 and the other end is expanded in the width direction of the upper plate 16. The aperture 28 extends from the recess 30 to the upper surface of the upper plate 16. The recess 30 is arranged so as to overlap in part with the recess 22 of the lower plate 12 when the heat sink 10a is viewed from above along the Z-axis. This overlap portion is hatched in FIG. 4. Corners 30a of the recess 30 are made in a curved shape, in order to reduce the flow resistance of the cooling water flowing in the heat sink 10a, so as to reduce stagnation. This recess 30 can be formed, for example, by etching of the lower surface of the upper plate 16.

The partition plate 14 is a flat plate having a thickness of about 100 μm and has two apertures 34, 36 penetrating the partition plate 14, at positions corresponding to the respective apertures 18, 20 of the lower plate 12. The partition plate 14 has a plurality of water-conducting holes 38 penetrating the partition plate 14, on the opposite side to the apertures 34, 36. These water-conducting holes 38 are arranged at positions where they overlap with both of the recesses 22 and 30 when the heat sink 10a is viewed from above along the Z-axis. Therefore, the recesses 22 and 30 are in communication with each other through the water-conducting holes 38. The water-conducting holes 38 can be formed, for example, by etching of the partition plate 14 from the both surfaces.

The upper surface of the upper plate 16 has a laser mount region R2a on which the laser array 2a as a heat generating body to be cooled is mounted. The water-conducting holes 38 are located immediately below the laser mount region R2a.

Since the laser array 2a has a nearly rectangular parallelepiped shape, the laser mount region R2a is of a rectangular shape. The plurality of water-conducting holes 38 are arranged at even intervals along the longitudinal direction of the rectangular shape (the Y-axis direction in FIG. 1), i.e., in the direction in which the light emitting portions 52 of the laser array 2 are arranged.

As shown in FIGS. 3 to 6, in a state in which the upper surface of the lower plate 12 is joined to the lower surface of the partition plate 14, a space 40 is formed by the recess 22 of the lower plate 12 and the lower surface of the partition plate 14. This space 40 is an inflow channel into which cooling water 48 flows through the supply tube 5. On the other hand, in a state in which the upper surface of the partition plate 14 is joined to the lower surface of the upper plate 16, a space 42 is created by the recess 30 of the upper plate 16 and the upper surface of the partition plate 14. This space 42 is an outflow channel from which the cooling water 48 is discharged into the discharge tube 6.

When the lower plate 12, partition plate 14, and upper plate 16 are joined to each other, the aperture 18 formed in the lower plate 12, the aperture 34 formed in the partition plate 14, and the aperture 26 formed in the upper plate 16 are connected to each other, to form the inlet 44 as shown in FIG. 6. The inlet 44 receives the cooling water 48 from the outside of the laser stack apparatus 1 through the supply tube 5 and supplies the cooling water 48 to the inflow channel 40. The aperture 20 formed in the lower plate 12, the aperture 36 formed in the partition plate 14, and the aperture 28 formed in the upper plate 16 are connected to each other to form the outlet 46. The outlet 46 receives the cooling water 48 from the outflow channel 42 and discharges the cooling water 48 through the discharge tube 6 to the outside of the laser stack apparatus 1.

As shown in FIGS. 4 to 7, a continuous refrigerant channel is constructed by the inflow channel 40, outflow channel 42, and water-conducting holes 38. The inlet 44 and outlet 46 also form parts of this refrigerant channel. The water-conducting holes 38 squirt the cooling water supplied into the inflow channel 40, to the outflow channel 42. For this purpose, the water-conducting holes 38 have a cross section sufficiently smaller than that of the inflow channel 40.

The heat sinks 10a-10c effect heat exchange with the laser arrays 2a-2c during driving of the laser arrays 2a-2c to reduce the temperature thereof. Since the jet flow of the cooling water made by the water-conducting holes 38 collides with the portion of the upper plate 16 located immediately below the laser arrays 2a-2c, the laser arrays 2a-2c are efficiently cooled.

The partition plate 14 is made of a material having a coefficient of thermal expansion lower than that of Cu making up the lower plate 12 and the upper plate 16. This material preferably has a high electric conductivity. Examples of materials satisfying these conditions include Ni, Au, W, Pt, Ti, and stainless steel (SUS). The coefficient of linear thermal expansion of Ni is $12.8 \times 10^{-6}$/K; that of Au $14.2 \times 10^{-6}$/K; that of W $4.5 \times 10^{-6}$/K; that of SUS $10.0 \times 10^{-6}$/K; that of Pt $8.9 \times 10^{-6}$/K; that of Ti $8.6 \times 10^{-6}$/K. In contrast to it, the coefficient of linear thermal expansion of Cu is $16 \times 10^{-6}$/K. On the other hand, the thermal conductivity of Cu is higher than those of Ni, Au, W, Pt, Ti, and SUS. The laser arrays 2a-2c have the coefficient of thermal expansion lower than Cu. For example, where the laser arrays 2a-2c are of a GaAs type, the coefficient of linear thermal expansion thereof is about $6.5 \times 10^{-6}$/K; where they are of an InP type, the coefficient of linear thermal expansion thereof is about $4.5 \times 10^{-6}$/K.

Furthermore, the partition plate 14 is preferably made of a material with high corrosion resistance. The cooling water circulating in the refrigerant channel of the heat sinks 10a-10c steadily has pH of less than 7 due to dissolution of carbon dioxide in air, and in this acid condition the partition plate 14 is corroded by virtue of progress of such reactions as oxidation of an element making the partition plate 14 and reduction of dissolved oxygen. With progress of corrosion, the diameters of water-conducting holes 38 increase so as to result in failure in the jet flow of cooling water and possibly degrade cooling performance. The above-listed materials Ni, Au, W, Pt, Ti, and SUS have high corrosion resistance and are unlikely to be electrochemically corroded by electrolysis of the cooling water. For this reason, such materials can prevent expansion of the water-conducting holes 38 due to corrosion, and degradation of the cooling performance caused thereby. The above-listed materials are suitable for the partition plate 14 in this respect as well.

The below will describe the advantage of the present embodiment. In the present embodiment, the partition plate 14 having the coefficient of thermal expansion lower than that of the upper plate 16 and lower plate 12 is interposed between the lower plate 12 and the upper plate 16, whereby the partition plate 14 impedes thermal expansion and contraction of the upper plate 16 and lower plate 12. This lowers the total coefficient of thermal expansion of each heat sink and it becomes closer to the coefficient of thermal expansion of the laser arrays 2a-2c. Since the partition plate 14 is sandwiched between the lower plate 12 and the upper plate 16 having the same coefficient of thermal expansion, the heat sinks 10a-10c are unlikely to be curved with temperature change of the laser arrays 2a-2c. Therefore, it is feasible to reduce the stress on the laser arrays 2a-2c and the stress strain on the laser arrays 2a-2c due to the stress. This results in suppressing damage and characteristic degradation of the laser arrays 2a-2c and preventing detachment of the laser arrays 2a-2c from the heat sinks 10a-10c.

Since the lower plate 12 and the upper plate 16 have the coefficient of the thermal conductivity higher than that of the partition plate 14, the efficiency of heat exchange is increased between the upper plate 16 and the laser arrays 2a-2c and heat radiation of the heat sinks 10a-10c is enhanced, so as to achieve adequate cooling performance even if the thermal conductivity of the partition plate 14 is not so high. Particularly, Cu making the lower plate 12 and the upper plate 16 has the very high thermal conductivity and is inexpensive. Therefore, the heat sinks 10a-10c have good cooling performance and the production cost thereof is also low.

Since Ni, Au, W, Pt, Ti, or stainless steel used for the partition plate 14 has adequate electric conductivity and corrosion resistance, good electric conduction is established between the laser arrays 2a-2c and the durability of the heat sinks 10a-10c is enhanced.

The present invention was described above in detail on the basis of the embodiment thereof. It is, however, noted that the present invention is not limited to the above embodiment. The present invention can be modified in many ways without departing from the scope and spirit thereof.

In the above embodiment the semiconductor laser elements were mounted directly on the heat sinks, but it is also possible to adopt a configuration wherein each semiconductor laser element is mounted on a submount and wherein the submount is mounted on the heat sink. Instead of the laser arrays, a semiconductor laser element with a single light emitting portion may be mounted on the heat sink.

The same advantage as the above-described laser stack apparatus can also be enjoyed by a laser apparatus having a configuration wherein a single semiconductor laser element is mounted on the heat sink, instead of the configuration wherein a plurality of semiconductor laser elements are stacked through the heat sinks. An example of such laser apparatus has a structure obtained by eliminating the laser arrays 2b, 2c and the heat sinks 10b, 10c from the laser stack apparatus 1 shown in FIG. 1.

In the above embodiment the recess 22 formed in the lower plate is in communication with the inlet 44 and the recess 30 formed in the upper plate is in communication with the outlet 46; it is, however, also possible to adopt a configuration wherein the recess formed in the lower plate is in communication with the refrigerant outlet and wherein the recess formed in the upper plate is in communication with the refrigerant inlet.

As apparent from the above-described invention, the embodiment of the present invention may be modified in various ways. Such modifications are not a departure from the scope of the present invention and, as obvious to those skilled in the art, such modifications all are intended to be embraced within the scope of claims which will follow.

INDUSTRIAL APPLICABILITY

The present invention involves the use of the partition plate having the coefficient of thermal expansion lower than that of the first flat plate and the second flat plate, so as to reduce the total coefficient of thermal expansion of the entire heat sink, and thereby reduces the stress strain on the heat generating body such as the semiconductor laser element.

The invention claimed is:

1. A laser stack apparatus comprising a first heat sink, a second heat sink, a first semiconductor laser element, and a second semiconductor laser element,
   wherein each of the first heat sink and the second heat sink comprising:
      an electrically conductive first flat plate having an upper surface in which a first recess is formed;
      an electrically conductive second flat plate having a lower surface in which a second recess is formed, and an upper surface on which the heat generating body is to be mounted;
      an electrically conductive partition plate having a lower surface covering the first recess, an upper surface covering the second recess, and at least one through hole having the first recess communicated with the second recess;
      a refrigerant inlet extending from one of the first recess and the second recess and adapted for inflow of a refrigerant into the heat sink; and
      a refrigerant outlet extending from the other of the first recess and the second recess and adapted for outflow of the refrigerant from the heat sink,
      wherein the first flat plate and the second flat plate both have a first coefficient of thermal expansion, and
      wherein the partition plate has a second coefficient of thermal expansion lower than the first coefficient of thermal expansion, and
   wherein the first semiconductor laser element is located between the upper surface of the second flat plate of the first heat sink and a lower surface of the first flat plate of the second heat sink and has a coefficient of thermal expansion lower than the first coefficient of thermal expansion,
   wherein the second semiconductor laser element is mounted on the upper surface of the second flat plate of the second heat sink and has a coefficient of thermal expansion lower than the first coefficient of thermal expansion,
   wherein the first flat plate has a thermal conductivity higher than the partition plate,
   wherein the first flat plate and the second flat plate are comprised of Cu, and
   wherein the partition plate is comprised of one of Ni, Au, W, Pt, and stainless steel.

* * * * *